United States Patent [19]

Howatt et al.

[11] 4,103,264

[45] Jul. 25, 1978

[54] WAVE FILTER AND PROCESS FOR MAKING SAME

[75] Inventors: Glenn N. Howatt, Metuchen, N.J.; Murray Leonard, Mayfield Village, Ohio

[73] Assignee: Vernitron Corporation, Bedford, Ohio

[21] Appl. No.: 653,715

[22] Filed: Jan. 30, 1976

[51] Int. Cl.[2] .......................... H03H 9/04; H03H 9/10; H03H 9/20; H01L 41/22

[52] U.S. Cl. ...................................... 333/72; 29/25.35; 310/340

[58] Field of Search ................ 333/72, 30 R; 310/8.9, 310/8.0, 340, 341; 350/161; 29/25.35; 427/100; 331/107 A; 252/62.9 R, 62.9 PT

[56] References Cited

U.S. PATENT DOCUMENTS

| | | | |
|---|---|---|---|
| 3,209,178 | 9/1965 | Koneval | 333/72 |
| 3,650,003 | 3/1972 | Toyoshima | 29/424 X |
| 3,676,724 | 7/1972 | Berlincourt et al. | 310/8.2 |
| 3,747,176 | 7/1973 | Toyoshima | 310/340 X |
| 4,017,752 | 4/1977 | Kakehi et al. | 310/340 |

OTHER PUBLICATIONS

Dummer et al.—"Miniature and Microminiature Electronics", John Wiley & Sons, 1961; pp. 143–145 and Title page.

*Primary Examiner*—Alfred E. Smith
*Assistant Examiner*—Marvin Nussbaum

[57] ABSTRACT

In the manufacture of wave filters, such as FM filters, polarized piezoelectrically responsive wafers are provided, temporarily, on the active regions thereof, with a removable material. Subsequent to the encapsulation of the wafer by a protective but porous coating, the filter is heated and the removable material sublimates through the porous coating establishing a wafer surface substantially free of residual impurities and leaving an uninterrupted cavity between the wafer and the coating in the active regions. The preferred sublimatable material is paradichlorobenzene.

7 Claims, 5 Drawing Figures

WAVE FILTER AND PROCESS FOR MAKING SAME

This invention relates generally to electronic filters, such as piezoelectrically responsive wave filters and to the method for making such filters.

Wave filters of the general type referred to above are well known in the art and further reference may be had to, for example, U.S. Pat. No. 3,676,724 of July 11, 1972, entitled "Multi-Element Piezoelectric Circuit Component", showing a typical electronic filter constructed of piezoelectrically active material.

In brief summary, electronic filters are conventionally manufactured or produced by initially forming a suitably poled wafer of piezoelectric material which establishes piezoelectrically active and inactive regions. It is desirable that at least the active regions be free from any structural interference and for this purpose there is established a cavity between the wafer and the usual outer protective coatings. In the prior art paraffin wax in the form of carefully spaced-apart dots are applied, in registration, on both sides of the wafer. Thereafter, the wafer is coated with one or more layers of a protective material. The paraffin wax is then removed through the pores of the coating to form voids or cavities between the coating material and the wafer.

During the manufacture of such electronic filters, the piezoelectric material forming the wafer is initially polarized before treatment to produce a piezoelectrically responsive wafer, with one or more electrically conductive leads being attached to the wafer by conventional procedures. Inasmuch as the electronic filters must avoid damping due to structural interference, the degree of removal of the wax will affect in large measure the electrical properties of the filter and residual impurities thereof on the wafer will detrimentally affect such properties. Hence the effectiveness of the wax removal and the establishment of cavities adjacent to the active regions of the wafer constitutes a step in the manufacturing process which is of paramount importance. Any significant contact between the outer coating and an active region of the wafer will either render the filter inoperative or produce undesirable effects in terms of the frequency, band width, coupling, insertion loss and the like characteristics of a filter.

One of the problems with prior art techniques of forming the above type of filters relates to the use of the paraffin wax as the cavity-forming material (i.e. the disposable material). Paraffin wax, for application to the wafer, is normally heated to form a molten mass and is applied by suitable devices in the form of spaced apart dots to the wafer. After application, it is permitted to solidify at room temperature. Once the wafer with the paraffin wax dots is coated with the protective coating material, the paraffin wax must be removed by initially melting it, and then removing the same by means of a solvent through the normally porous protective coating. For this purpose, the melting and washing out of the disposable paraffin wax is carried out in baths of the solvent at elevated temperatures; however to substantially remove the wax, extended periods of time are required. For this purpose the filters must be mounted on a suitable device for moving the filters through the solvent bath or alternately, by recirculating the solvent baths to remove the paraffin wax from the pores of the protective coating material. Such extended periods of time may be 12 to 24 hours or more and in practice, it is very difficult if not impossible to remove substantially all of the wax from the filters. Failure to remove substantially all of the wax deleteriously affects the performance of the electronic filter and for good quality control, each filter produced using the paraffin wax technique must be tested to determine its characteristics before being released to the market. Notwithstanding all of the precautions normally taken during production of such electronic filters, a portion of such filters must still be rejected due to the fact that the paraffin wax is not totally removed — i.e., there is a residue remaining which renders the filter non-acceptable.

The utilization of spaced-apart points or dots of the disposable material on the wafer requires specialized equipment, which is quite expensive. Unfortunately, this optimization approach has certain definite drawbacks. There is a direct ratio between minimum coverage (i.e. maximum optimization) and the degree of accuracy required to properly locate the dots or the like. However, the use of such dots have become quite common because the limited wax coverage optimizes the subsequent removal operation. Thus, unless the registration of the points or dots is exactly performed, the resulting filters may be non-performing — i.e. they are useless. This invention eliminates the need for such precision in that it facilitates the ready removal of the disposable material after coating.

With this invention, applicants have developed an improvement in the process of producing filters particularly those of the above type, in which the problems associated with the use of paraffin wax as the disposable material are overcome while at the same time, providing additional advantages which heretofore could not be obtained using the wax technique.

It is therefore the primary object of the present invention to provide an improved method for making electronic components, such as wave filters, in which a cavity of very small dimension, is established between piezoelectrically active regions and outer protective coatings.

It is a more specific object of the present invention to provide a method for making a filter of the type indicated in the preceding paragraph, in which the cavity is established by means of a disposable material which is removed subsequent to the application of the porous material, by means of sublimating or evaporating the disposable material, by means of heat treatment, through the porous outer coating without leaving on the piezoelectrically active regions a residue on such region which may impair the electrical properties or characteristics of the filter.

It is a further object of the present invention to provide a method for making a filter of the type described above in which the need for utilizing and closely registering dots, or similar geometric configurations, on the piezoelectrically active regions is obviated.

It is a still further object of the present invention to provide a filter and a method for making same in which the cavity between the piezoelectrically active region and the outer coating is structurally uninterrupted.

It is a still further object of the present invention to provide a method of making a filter which facilitates the use of batch methods of operation and in general simplifies the steps of applying the disposable material and removing the same and, specifically, permitting the curing of the outer coating and the removal of the disposable material simultaneously.

An aspect of the present invention resides in a process of producing electronic components, such as filters, which includes the steps of providing a polarized wafer body having piezoelectrically active regions and depositing disposable material on at least one such active region and subsequently applying to the wafer and on the disposable material a porous protective coating. The wafer, in this form, is heat treated to remove the disposable material and to establish a cavity between the wafer body and the coating. The disposable material is sublimatable at elevated temperatures and is in a solid state at temperatures below 80° F.

A further aspect of the present invention resides in providing an electronic wave filter in which the wave filter has piezoelectrically active regions and at least one protective coating surrounds and encapsulates the wafer. The filter has a continuous and uninterrupted cavity covering from about 10 to 60% of the surface of the wafer, between the wafer and the protective coating. The cavity extends between the protective coating and the wafer to prevent contact of the active regions of the wafer with the protective coating.

For a better understanding of the present invention, together with other and further objects thereof, reference is had to the following description, and its scope will be pointed out in the appended claims.

In the drawing:

FIG. 1 is a perspective illustration of the wave filter disclosed and described in U.S. Pat. No. 3,676,724 issued July 11, 1972, to Berlincourt et al;

Figure 1:
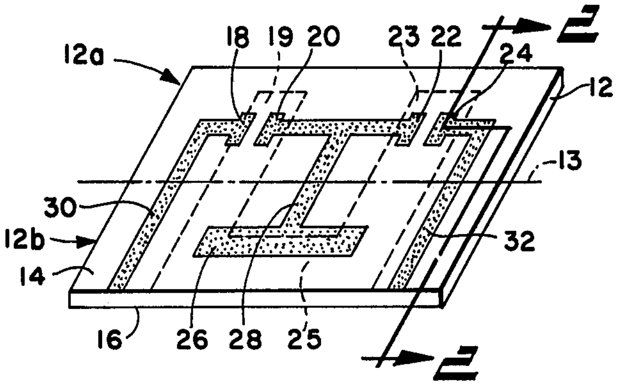

Referring now more specifically to the present invention, the method provides as an initial step, a wafer having piezoelectrically active or responsive regions, usually obtained by polarizing the wafer-forming material after the latter is formed into a wafer, followed by treatment of the wafer to apply to the active regions the disposable compound capable of sublimation or evaporation at elevated temperatures and which is normally solid below about 80° F. In this step, the disposable sublimatable compound is applied to the wafer either in the form of spaced-apart dots or the like according to conventional techniques — or, preferably, by coating a predetermined area ranging from about 10 to about 60% of the total area of the wafer. Thereafter, the wafer with the disposable sublimatable material is coated with a porous protective coating so that the product thus obtained forms a wafer having the disposable, sublimatable material between the wafer and the protective porous overcoat. In the next step of the process of this invention, the resulting product is then heated at elevated temperatures to cause the disposable sublimatable material to sublimate or evaporate through the porous coating and to thereby form a product in which there is a cavity in the areas previously occupied by the disposable sublimatable material and between the protective overcoat and the wafer. If desired, a further protective non-porous coating may then be applied over the porous overcoat.

The porous protective coating is preferably one which can be cured or hardened at elevated temperatures — preferably within the temperature range required for sublimation or evaporation of the disposable sublimatable material otherwise used in the process of the present invention. Thus, during the step of hardening or curing the protective coating, the same heat treating step will simultaneously cause the disposable material to sublimate and thus remove the material while at the same time curing the protective coating.

The disposable sublimatable compositions used in the present invention may be any composition capable of substantially complete sublimation upon application of suitable heat to the electronic filter and which composition, at the same time, is preferably solid at temperatures below about e.g. 80° F. and is capable of sublimation at elevated temperatures. Within this context, a most preferred composition for use in the present invention is para-dichlorobenzene (1,4-dichlorobenzene) which at room temperature, is a white crystalline material. Another typical compound which may be used within the scope of the present invention is iodine, which may likewise find application in the process which, however, has certain environmental drawbacks.

The most significant discovery in relation to making the filter has been that since the compound 1,4-dichlorobenzene is a compound which sublimes readily it will leave no residue and thereby significantly enhances the potential quality of the desired filter. The material is capable of being liquified at temperatures above room temperature permitting the same to be readily applied to the wafers at temperatures slightly above room temperature and upon application of the composition to the wafers, the 1,4-dichlorobenzene solidifies again at room temperature. Thus, upon application of nominal heat requirements, 1,4-dichlorobenzene may be liquified and readily applied to the wafer and again solidified. In a similar manner, iodine can be placed into a form capable of being applied to the wafers with very few processing steps and like the 1,4-dichlorobenzene, it is readily sublimated at elevated temperatures.

The amount of the compound normally employed in the process of this invention, in application to the wafers, is not critical and may vary according to well known criteria in this art for that purpose. Thus, in following conventional techniques in applying spaced-apart dots in registration on the wafer, the thickness of the sublimatable compound or composition need only be sufficient to permit the formation of a void or cavity between the subsequent protective coating and the material forming the wafer so as to provide a proper functioning filter, upon removal of the disposable sublimatable compound. Normally, for most purposes, this disposable and sublimatable material is kept to a relatively nominal thickness.

When employing 1,4-dichlorobenzene, it may be desirable to provide sufficient ventilation due to the odor normally associated with this compound; while in the case of using iodine as the disposable sublimatable compound, appropriate safeguards must be employed since the vapors released by this compound are poisonous. Such safeguards are well known to those skilled in the art dealing with iodine.

It will be also understood that within the scope of this invention, the 1,4-dichlorobenzene or other disposable sublimatable compounds such as iodine, can be applied to the wafers in any convenient form — that is to say, with or without a carrier. If a carrier is employed, it too must be capable of sublimation or otherwise readily removed once the disposable sublimatable compound is applied to the wafer and should likewise not leave any residue which would otherwise interfere with the properties of the filter. However, for most purposes, the use of 1,4-dichlorobenzene does not require a carrier.

In the context of the present invention certain liberties are taken with respect to the term sublimation. Paradichlorobenzene sublimates under well known temperature and pressure conditions. In a strictly scientific sense sublimation would preclude an intervening liquid state. However, in the process according to this invention, it is unimportant that the disposable material may briefly be in a liquid state before it becomes gaseous and evaporates. Hence, as the term sublimation is used herein it denotes the capability of changing state to a gaseous or vapor form either directly or indirectly from a solid state. The main criteria being that all the material in its vapor state readily escapes through the pores of the coating without leaving a residue. On the other hand, however, the disposable material is sublimatable which term is helpful to characterize the material for the purpose of describing and claiming the present invention.

The disposable, sublimatable compound or composition can be applied so as to provide a coating of the compound or composition covering a continuous or structurally uninterrupted area ranging from about 10 to about 60% of the total area of the wafer. Thus, according to such a novel technique, the disposable sublimatable compound or composition forms a continuous coating over 10 to about 60% of the surface of the wafer so that upon application of the porous protective coating, and treatment of the resulting structure, a cavity is formed between the porous protective overcoat and the wafer in an amount extending from about 10 to about 60% of the surface of the wafer. Such an arrangement, as also explained hereinafter, has been found to yield improved filters.

In the case where the compound or composition is applied in the form of a continuous coating on one or more surfaces of the wafer to an extent of from about 10 to about 60% of the surface area of the wafer, it has been found highly expedient to employ a batch method and a device for retaining a plurality of wafers, e.g. 20 to 40 or more, mounted on a suitable frame, whereby the latter are dipped into the disposable solution to provide a coating to the desired degree over the surface of the wafer. Particularly beneficial results have been found where from about 20 to about 50% of the total surface area of the wafer is dipped with the disposable sublimatable material.

Normally, in carrying out the process of the present invention wherein the wafers are dipped in the solution to coat from about 10 to about 60% of the total surface area of the wafer with the disposable, sublimatable material, the end opposed to the end carrying the leads is treated and normally the wafer is coated on both sides so that a continuous cavity will be formed between both major surfaces of the wafer. However, depending on the type of filter being employed, only a portion of one surface, or one surface alone, may be treated.

The protective coating used in the filters of the present invention may be any suitable protective coating according to conventional techniques in this art. Such coatings are porous in nature and are generally composed of synthetic resins. Typically, by way of example, phenolic-formaldehyde resins may be employed for this purpose such as those marketed under the trademark "DUREZ" which comprise a phenol-formaldehyde resin — or alternately, may be based on diallyl phthalate. However, as will be understood, other suitable protective compositions may be employed for this purpose. In addition, the thickness of the coating and other characteristics required are likewise according to conventional expedients in this art and to this end, it will be understood that more than one protective coating may be employed. Thus, protective coatings having differing characteristics may be employed and in a preferred embodiment of the present invention, an initial or first protective coating is applied to wafer having the disposable sublimatable material thereon and which initial coating is of a porous nature. Thereafter, following removal of the disposable material, a second protective coating having non-porous characteristics may be employed. Typical of the second coatings are the synthetic resins which upon curing, yield hard non-porous coverings for the filters and such coatings may be, for example, based on epoxy resins.

The product resulting from the above improved process can be characterized as an electronic filter having improved characteristics and which comprises an activated wafer having a pair of opposed major faces, the wafer having a protective coating thereon and which substantially encapsulates the wafer and a cavity between the wafer and the protective coating, the cavity being a substantially continuous cavity extending between the protective coating and the active wafer to an extent of from about 10% to about 60% of the total surface area of the wafer with the cavity forming a void preventing contact of the active surfaces of the wafer with the protective coating.

EXAMPLE 1

The following example illustrates a typical prior art procedure for preparing FM wave filters utilizing as the disposable material, paraffin wax.

Piezoelectric wafers, prepared according to conventional techniques, were provided — such wafers having been previously processed according to conventional techniques to polarize the ceramic material with the application of electrically conductive leads, etc. In the next step of processing, the wafers are transported to a machine which receives the wafers, as produced by the prior operations, one-by-one, and the machine applies four spaced apart dots of paraffin wax in registry on the wafer. As previously explained, the function of the disposable material is to prevent the protective coating from coming into contact with the wafer.

The wafers thus provided with disposable spaced apart dots of the wax are then transported to a tank where they are dipped into a liquid mass of a phenol-formaldehyde resin (that marketed under the trademark "DUREZ") to provide a protective coating completely covering the wafer and the disposable wax material. Processing of the wafers for coating with the protective material may be carried out on a back scale by mounting the wafers onto a suitable carrying and retaining frame, whereafter a plurality are dipped into the liquid bath of "DUREZ". The resulting coated wafers are then transported to a curing station, where they are placed into an oven to cure. The protective coating then hardens to form a porous envelope about the wafer and the disposable wax material. Typically, the coated wafers are left over an extended period of time, e.g. 12 hours or more, in a heating chamber at, e.g. 120° F., to cure the coating and to form a porous envelope about the wafer and the disposable wax material.

Subsequently, the wafers are removed from the heating chamber and permitted to cool to room temperature, whereafter they are then mounted on a frame over a solvent bath. The solvent bath is heated and is continuously agitated to provide fresh solvent to permit penetration of the solvent into the pores of the porous coating to remove the wax. In addition, following the removal of the disposable material, a further protective coating of an epoxy resin was applied by dipping the product into a liquid bath of the resin to completely coat the same.

The individual resulting filters are then tested to remove the defective filters — the defective filters being those which have failed to have all of the disposable wax material removed.

EXAMPLE 2

Repeating the procedure of Example 1, but in this case utilizing as the disposable material, 1,4-dichlorobenzene, wafers are produced using the above steps and employing spaced apart dots in registry on the wafer. The compound 1,4-dichlorobenzene, used as the disposable material, is sublimatable; in place of following the above teachings of Example 1 with regard to the removal of the disposable material by means of a heated solvent bath, the wafers are merely coated with the "DUREZ" and placed in a heated oven at 120° F. for curing of the coating overnight. At these temperatures, the compound 1,4-dichlorobenzene sublimates or evaporates and upon inspection of the resulting filters following removal of the same from the curing oven, it was found that in substantially all cases, the 1,4-dichlorobenzene had been removed leaving no residue and the required voids or cavities between the DUREZ coating and the water surface. The amount of non-performing filters, due to retention of the disposable material between the protective coating and the wafer surface, was found to be negligible compared to the percentage of non-performing filters produced according to prior art techniques using paraffin wax as the disposable material.

EXAMPLE 3

The procedure of Example 2 was repeated but in this case, in place of employing the apparatus to apply spaced-apart dots in registry on the wafer surface, a plurality of filters processed according to previous operations were merely mounted on a retention device and dipped in a liquid bath of 1,4-dichlorobenzene to coat the filters to a depth of approximately ⅓ of their length — i.e. approximately 33% of their surface was coated with 1,4-dichlorobenzene to form a continuous coating about the treated portion of the wafer. The wafer was then processed according to the steps described in Example 2. After curing, and application of a further protective coating of epoxy resin, the filters were found to have improved performance characteristics compared to conventional filters which employed spaced-apart cavities or voids.

FIG. 1 shows the wave filter disclosed in the aforementioned U.S. Pat. No. 3,676,724 to Berlincourt as being a representative sample of a filter with which the improved procedures of the present application are used. A wave filter is in the form of a wafer 12 divided into two regions **12*a* and 12*b* by a dividing line 13. Region 12*a* is piezoelectrically active and region 12*b* is piezoelectrically inactive. Wafer 12 is made of ceramic material which can be rendered piezoelectric by exposure to a high dc electric field (a process called poling). Thus, region 12*a* represents the poled area of the ceramic and region 12*b* represents the unpoled area. Major surface 14 is provided with two electrode pairs 18, 20 and 22, 24; and surface 16 is provided with counter electrode means 19, 23 connected together by counter electrode 25. Each electrode and corresponding counter electrode means coact with the intervening piezoelectric material of wafer 12 to form a resonator element. Unpoled region 12*b* is provided with capacitor electrode 26 opposite from counter electrode 25 and is electrically coupled to the filter sections through connection 28. Leads 30 and 32 provide connecting means to an electric circuit, one acting as input and the other as output for the filter. The common external connection is made to counter electrode 25, which is formed integrally with counter electrodes 19, 23**. Electrical connection to the external circuit is accomplished at or close to the wafer well away from the range of significant acoustic vibration of all resonator elements. Further details of the wave filter and its operation are disclosed in the aforementioned Berlincourt patent.

Figure 2:
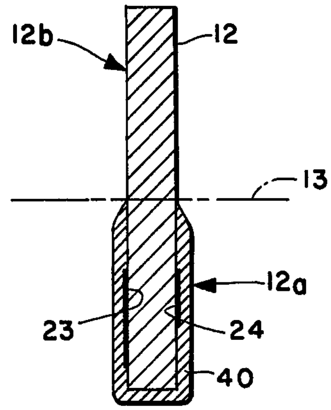
FIG. 2 is a cross-sectional elevational view taken generally on line 2—2 of FIG. 1 and showing the filter after it has been immersed in 1,4-dichlorobenzene.
Figure 3:
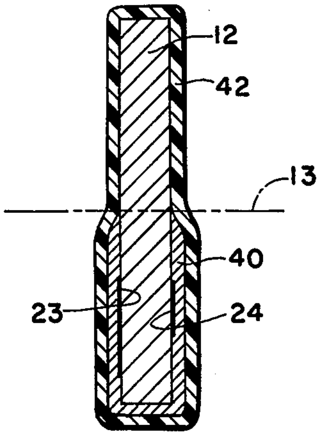
FIG. 3 is a view similar to FIG. 2 after the entire wave filter has been immersed in a protective material.
Figure 4:
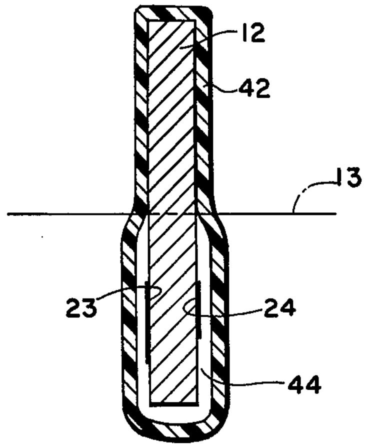
FIG. 4 is a view similar to FIGS. 2 and 3 showing the wave filter after the dichlorobenzene has been sublimated through the first protective coating.
Figure 5:
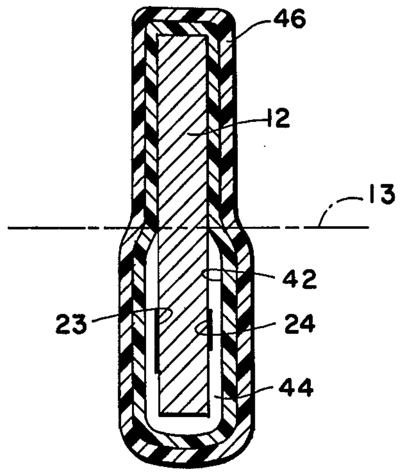
FIG. 5 is a view similar to FIGS. 1–4 showing the wave filter after a substantially non-porous protective coating has been applied thereto.

FIG. 2 shows the wave filter or wafer 12 after piezoelectrically active region **12*a* has been dipped up to dividing line 13 in 1,4-dichlorobenzene or other sublimatable material 40. The dichlorobenzene forms a coating on the active region 12*a* as generally shown in FIG. 2. The entire wafer 12 is then immersed in a relatively porous plastic coating 42 as shown in FIG. 3. The wafer may be handled during these procedures by wires connected to the leads 30 and 32 adjacent one edge of the wafer. The entire wafer is then positioned or hung within an oven for curing the coating 42. During curing, the material 40 sublimates through the coating 42 and leaves a cavity 44 as shown in FIG. 4 between the entire region 12*a* of the wafer and the coating 42. The entire wafer is then immersed in a relatively non-porous coating 46 which is then cured. The resulting wafer is as shown in FIG. 5**.

If desired, the sublimatable material can be applied only to small piezoelectrically active areas instead of to an entire surface. The resulting cavities allow the ceramic material to move in the cavity without any interference from the protective coating.

While there have been described what are at present considered to be the preferred embodiments of this invention, it will be obvious to those skilled in the art that various changes and modifications may be made therein without departing from the invention, and it is aimed, therefore, in the appended claims to cover all such changes and modifications as fall within the true spirit and scope of the invention.

What is claimed is:

1. In a process of producing electronic components such as filters, comprising the steps of providing a polarized wafer body having piezoelectrically active regions;

depositing a disposable material selected from the group consisting of 1,4-dichlorobenzene and iodine on at least said active regions;

subsequently applying to the wafer and on the disposable material a porous protective coating;

heat treating the wafer to sublimate or evaporate said disposable material through said coating establishing a cavity between the wafer body and said coating;

said disposable material being sublimatable at elevated temperatures and in a solid state at temperatures below 80° F.

2. A process as defined in claim 1, which includes the further step of applying to the resulting product a protective non-porous coating over said protective porous coating.

3. A process as defined in claim 1, wherein said protective porous coating is a composition capable of curing at elevated temperatures whereby when said coating is applied to said wafer and coats said wafer and said disposable material, and said coated wafer is heated, said protective porous material is cured or hardened while said compound or composition capable of sublimation sublimates or evaporates through said porous coating.

4. A composition as defined in claim 3, wherein said porous protective coating is a phenol-formaldehyde resin and completely encapsulates said wafer.

5. A process as defined in claim 2, wherein said protective non-porous coating is an epoxy resin.

6. A process as defined in claim 1, wherein said disposable, sublimatable material is applied to said wafer to coat from about 10% to about 60% of the total surface of said wafer with said material.

7. A process as defined in claim 1, wherein said disposable, sublimatable material is applied to said wafer to coat from about 20% to about 50% of the total surface of said wafer with said material.

* * * * *